United States Patent
Wang et al.

(10) Patent No.: US 9,153,506 B2
(45) Date of Patent: Oct. 6, 2015

(54) SYSTEM AND METHOD FOR THROUGH SILICON VIA YIELD

(75) Inventors: Chien Rhone Wang, Hsin Chu (TW); Kewei Zuo, Xinbei (TW); Chen-Hua Yu, Hsinchu (TW); Jing-Cheng Lin, HsinChu County (TW); Yen-Hsin Liu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 573 days.

(21) Appl. No.: 13/542,896

(22) Filed: Jul. 6, 2012

(65) Prior Publication Data

US 2014/0011301 A1 Jan. 9, 2014

(51) Int. Cl.
*G06F 19/00* (2011.01)
*H01L 21/66* (2006.01)
*H01L 21/768* (2006.01)

(52) U.S. Cl.
CPC .......... *H01L 22/20* (2013.01); *H01L 21/76898* (2013.01); *H01L 22/12* (2013.01)

(58) Field of Classification Search
CPC .............................. G05B 1/00; G05B 2219/00
USPC .................. 257/502, 774; 438/15, 25, 26, 51; 716/138; 700/121, 119
See application file for complete search history.

(56) References Cited

U.S. PATENT DOCUMENTS

| | | | |
|---|---|---|---|
| 7,359,759 B2 * | 4/2008 | Cheng et al. | 700/121 |
| 7,593,912 B2 | 9/2009 | Cheng et al. | |
| 7,603,328 B2 | 10/2009 | Cheng et al. | |
| 7,867,821 B1 * | 1/2011 | Chin | 438/107 |
| 7,998,853 B1 * | 8/2011 | Rahman | 438/618 |
| 2005/0288812 A1 * | 12/2005 | Cheng et al. | 700/109 |
| 2008/0275586 A1 | 11/2008 | Ko et al. | |
| 2009/0292386 A1 | 11/2009 | Cheng et al. | |
| 2011/0060441 A1 | 3/2011 | Ko et al. | |
| 2011/0251707 A1 | 10/2011 | Cheng | |

* cited by examiner

*Primary Examiner* — Mohammad Ali
*Assistant Examiner* — Sheela S Rao
(74) *Attorney, Agent, or Firm* — Haynes and Boone, LLP

(57) ABSTRACT

The present disclosure provides one embodiment of an integrated circuit (IC) fabrication method to form an IC structure having one or more through silicon via (TSV) features. The IC fabrication method includes performing a plurality of processing steps; collecting physical metrology data from the plurality of processing steps; collecting virtual metrology data from the plurality of processing steps based on the physical metrology data; generating a yield prediction to the IC structure based on the physical metrology data and the virtual metrology data; and identifying an action at an earlier processing step based on the yield prediction.

20 Claims, 12 Drawing Sheets

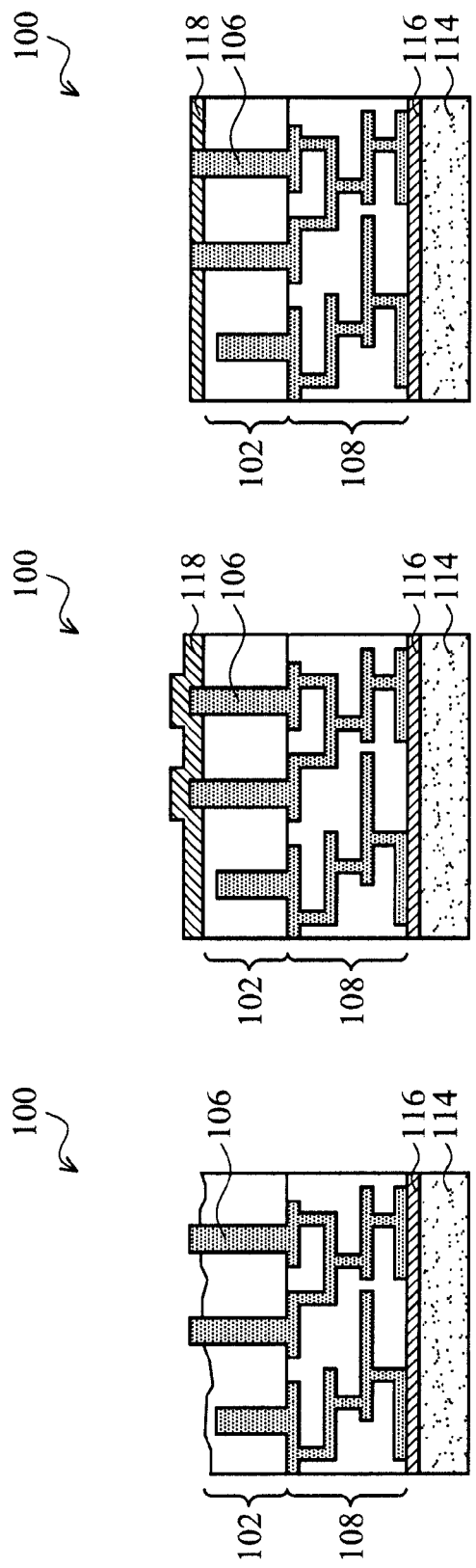

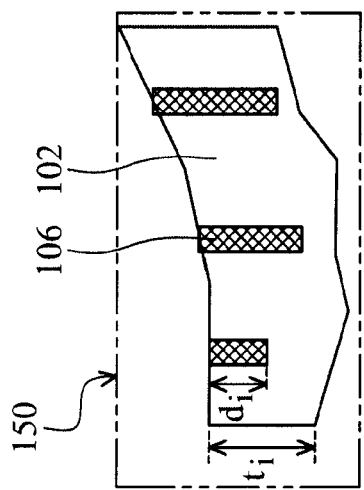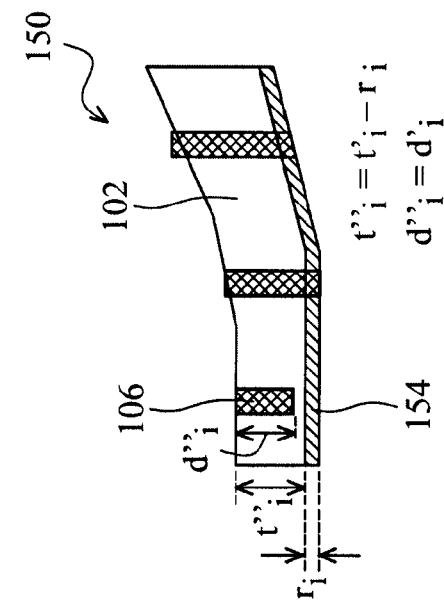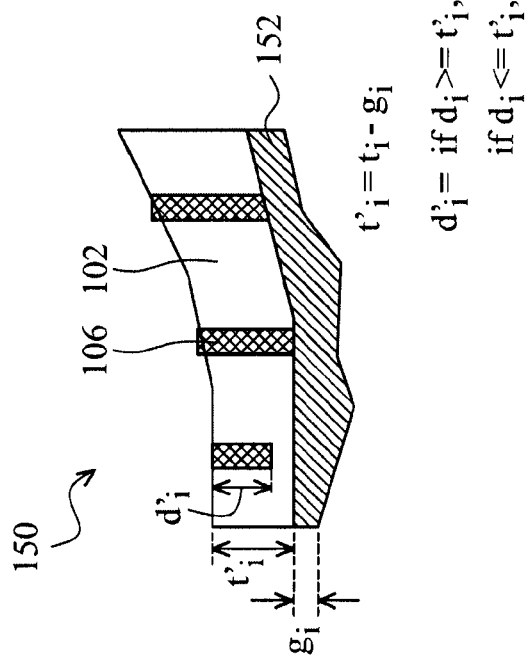

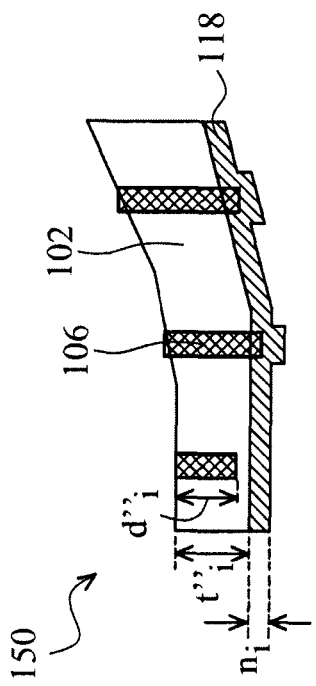
Fig. 2D
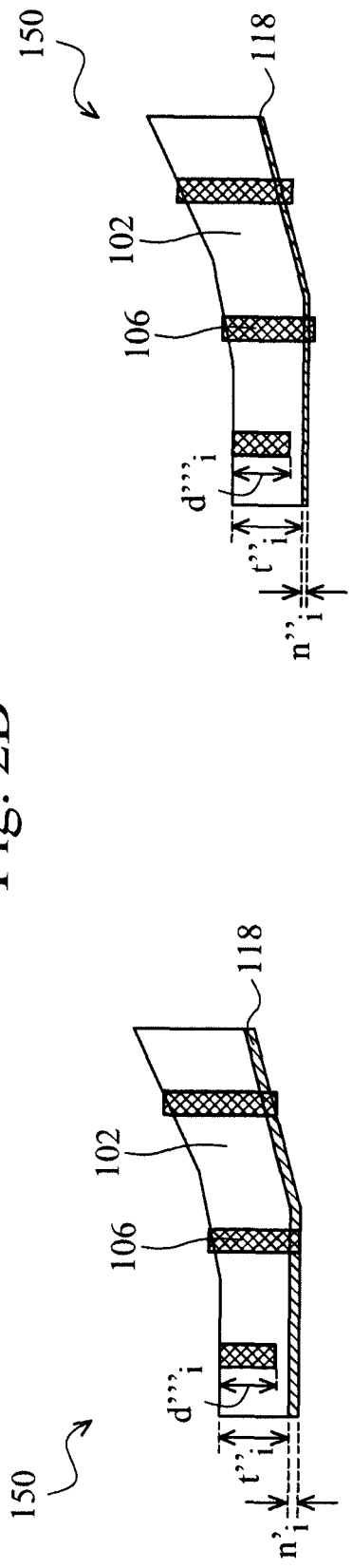
Fig. 2E
$d'''_i = \text{if } t''_i + n'_i <= d''_i, t''_i + n'_i$
else, $d''_i$
Fig. 2F
TSV protrusion = $d'''_i - t''_i - n''_i$;
Open Risk = f(TSV protrusion)

SYSTEM AND METHOD FOR THROUGH SILICON VIA YIELD

BACKGROUND

Semiconductor integrated circuits wafers are produced by a plurality of processes in a wafer fabrication facility (fab). These processes, and associated fabrication tools, may include deposition, polishing, grinding, thermal oxidation, diffusion, ion implantation, rapid thermal processing (RTP), chemical vapor deposition (CVD), physical vapor deposition (PVD), epitaxy, etch, and photolithography. During the fabrication stages, products (e.g., semiconductor wafers) are monitored and controlled for quality and yield using metrology tools. As integrated circuits feature sizes are reduced, the amount of monitoring and controlling may need to be increased. This, however, increases costs by the increased quantity of metrology tools required, the increased manpower to perform the monitoring and controlling, and the associated delay in manufacturing cycle time. Furthermore, identification of failure at later metrology stage may not initiate earlier action and introduce even higher manufacturing cost.

Electric performances, such as interconnect resistance or through silicon via (TSV) connectivity yield, can only be measured at wafer acceptance test (WAT) or chip probe (CP) stages. These measurement stages are usually very far behind key process stages. This will greatly limit possible remedy actions, such as rework, pre-screening for scrap or process control. This problem is even tougher when detecting TSV yield. In current practice, yield measurement is only possible on products with daisy chain structures, while this is not practical on customer products. For customer TSV products, especially interposer, there is no effective yield measurement method. Measurement time delay makes rework not feasible. Measurement time delay makes advanced process control (APC) not feasible. Additionally, pre-screening for reducing cost is not feasible.

Therefore, what is needed is system and method for an integrated circuit fabrication integrated with monitoring, predicting and controlling a quality and/or yield of IC products.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A through 1L are sectional views of an integrated circuit (IC) structure at various fabrication stages constructed according to aspects of the present disclosure in one or more embodiments.

FIGS. 2A through 2F are fragmentary sectional views of an IC structure at various fabrication stages constructed according to aspects of the present disclosure in one or more embodiments.

FIG. 8 is one embodiment of a virtual fabrication system, in which the system of FIG. 7 may be integrated in.

DETAILED DESCRIPTION

Figure 1C:
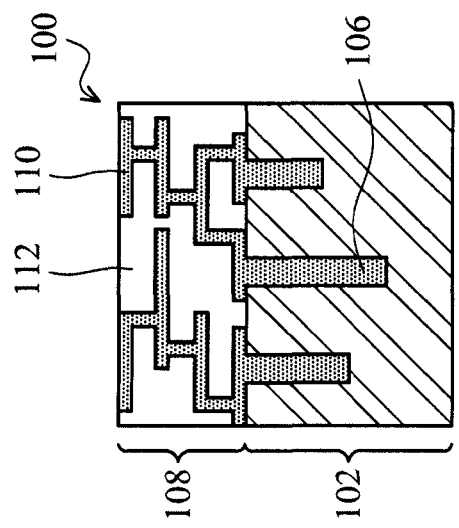

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. A novel method to enable wafer result prediction of batch processing tools is provided and described below with various examples, embodiments, variations, and descriptions.

FIGS. 1A through 1L are sectional views of an integrated circuit (IC) structure 100 at various fabrication stages constructed according to aspects of the present disclosure in one or more embodiments. An IC structure and corresponding IC fabrication method are collectively described with reference to FIGS. 1A through 1L.

The IC structure 100 includes through silicon via (TSV) features formed thereon and may be used for three-dimensional IC integration. For example, the IC structure 100 may be diced into multiple dies. The IC structure or each die may be used as an interposer to be bonded between two IC chips and electrically coupled the two IC chips together.

Figure 1B:
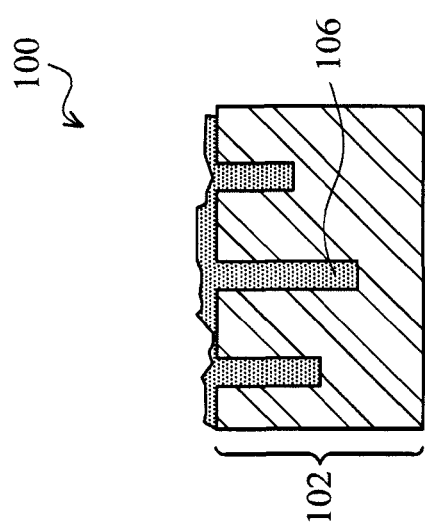
Figure 1A:
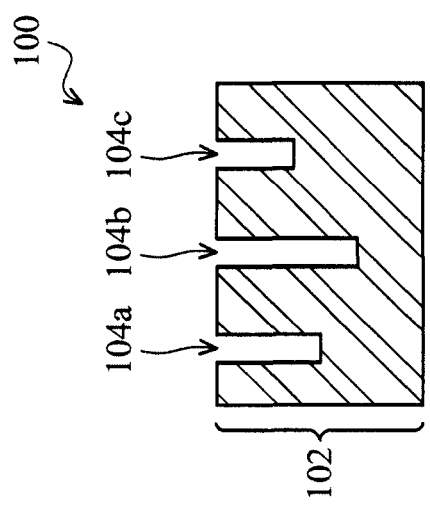

Referring to FIG. 1A, the IC structure 100 includes a substrate 102, such as a silicon wafer or other suitable substrate. In various examples, the other suitable substrate may include glass. A via etching process is applied to a front surface of the substrate 102 to form TSV holes 104, such as exemplary TSV holes 104a, 104b and 104c. In one example, a lithography process is applied to the substrate 102 to form a patterned resist layer having various openings that define the TSV holes. Then the via etching process is applied to the substrate 102 using the patterned resist layer as an etch mask.

Referring to FIG. 1B, one or more TSV features 106 are formed in the TSV holes 104. The formation of TSV features 106 includes deposition and polishing. A metal material, such as copper, aluminum or tungsten, is deposited on the substrate 102 and the TSV holes 104. A polishing process, such as chemical mechanical polishing (CMP), is then applied to the substrate 102 to remove the excessive conductive material and planarize the front surface of the substrate 102.

Referring to FIG. 1C, an interconnect structure 108 is formed on the substrate 102 by a suitable technology, such as dual damascene process in one example. The interconnect structure 108 includes conductive features 110, such as metal lines, via and contact features. The conductive features 110 are isolated from each other by interlayer dielectric (ILD) material 112 and are electrically coupled with the TSV features 106.

Figure 1F:
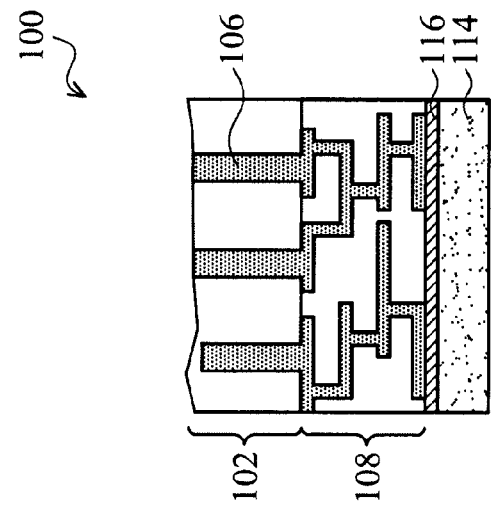
Figure 1E:
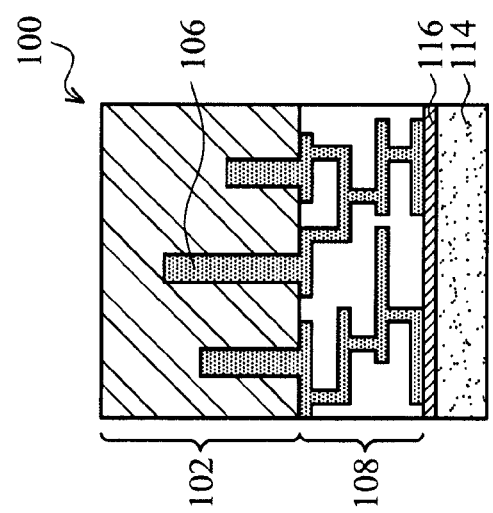
Figure 1D:
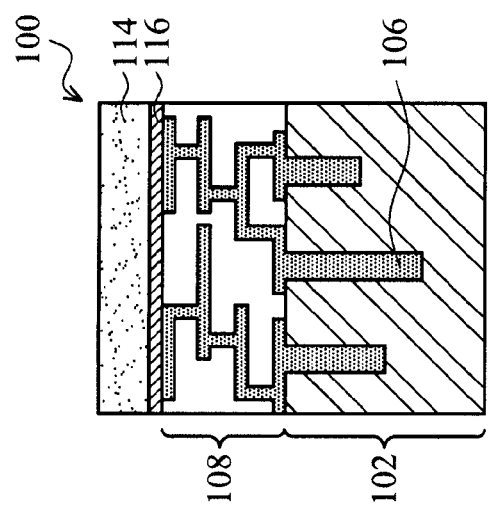

Referring to FIG. 1D, another substrate 114, such as a glass substrate, is bonded to the front surface of the substrate 102 by a suitable bonding material 116, such as glue. The IC fabrication proceeds to backside of the substrate 102 illustrated in FIG. 1E, which is same as FIG. 1D but is shown upside down.

Referring to FIG. 1F, a grinding process is applied to the backside of the substrate 102 to reduce the thickness thereof.

Referring to FIG. 1G, a recessing process is further applied to the backside of the substrate 102 to selectively etch the substrate 102 but not etch the TSV features 106. Thus, the substrate 102 is recessed and the TSV features 106 are protruded from the backside surface. The recessing process includes an etching process to selectively etch the material of the substrate 102 that is silicon in the present example.

Referring to FIG. 1H, a dielectric material layer 118, such as silicon nitride (SiN), is formed on the backside of the substrate 102 by a suitable technology, such as chemical vapor deposition (CVD). The dielectric material layer 118 covers the TSV features 106 as well.

Referring to FIG. 1I, the backside of the substrate 102 is polished to reduce the thickness of the dielectric material layer 118 and to have the TSV features 106 exposed from the backside surface. In one example, the polishing process includes a CMP process.

Figure 1J:
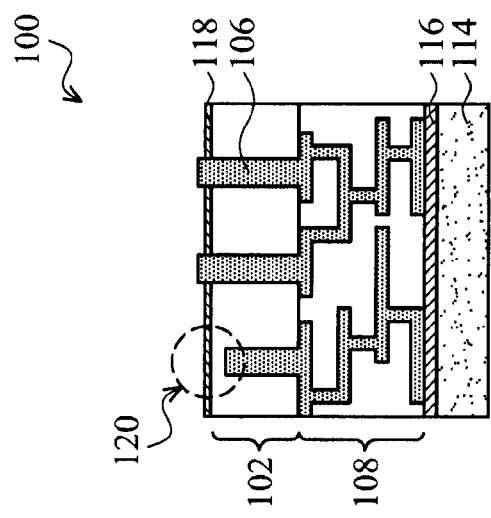

Referring to FIG. 1J, an etch-back process is applied to selectively etch the dielectric material layer 118, further reducing the thickness of the dielectric material layer 118 and having the TSV features 106 protruded. If a TSV feature is not high enough, it will be covered by the dielectric material layer 118 and will not be exposed and protruded. One such example is shown in FIG. 1J and marked by a dashed circle 120.

Figure 1K:
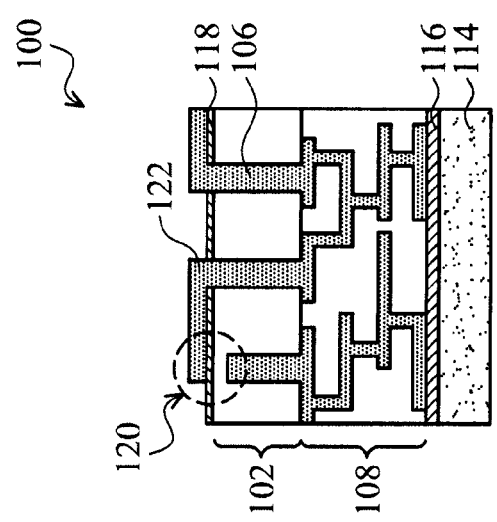
Figure 1L:
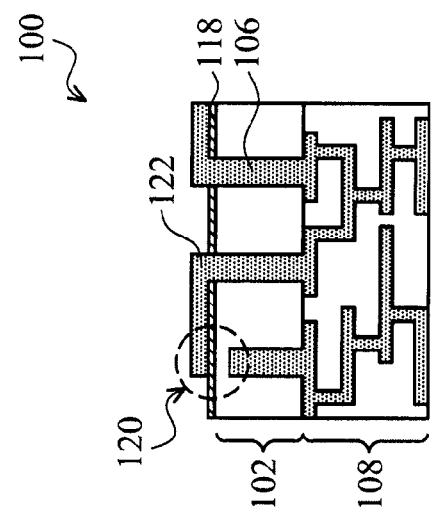

Referring to FIG. 1K, in one example, a redistribution layer (RDL) 122 is formed on the backside of the substrate 102 and is patterned to electrically couple with the TSV features 106. The RDL 122 includes one or more conductive material, such as metal, and is formed by a procedure including metal deposition, lithography process and etching. The glass substrate 114 is removed afterward, as illustrated in FIG. 1L.

The RDL 122, TSV features 106 and the interconnect structure 108 are configured to form one or more daisy chain. Due to the issue caused by the short TSV feature, an open issue at 120 causes the daisy chain is open and the device failure. This issue is identified at a later stage, such as WAT and CP test. It would be too late to fix the issue. Furthermore, if a failed interposer is used in a 3D integration, it will eventually be scraped with bonded IC chips, causing more fabrication loss.

Figure 3A:
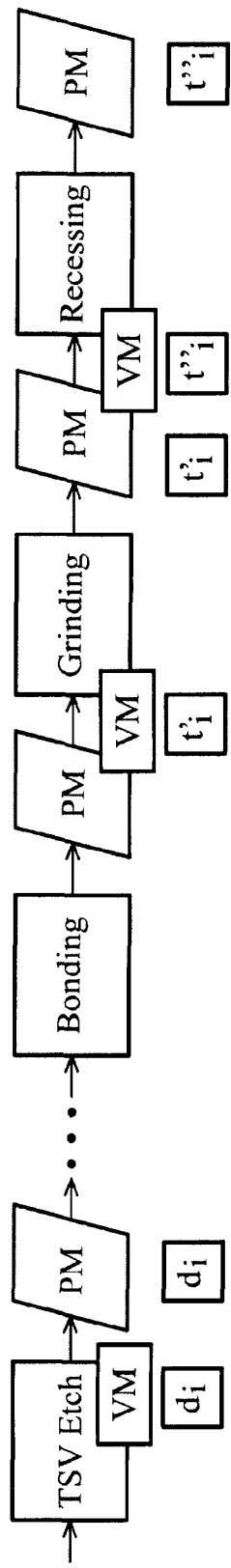
FIGS. 3A and 3B are block diagrams illustrating processing flow of an IC fabrication method constructed according to aspects of the present disclosure in one or more embodiments.
Figure 3B:
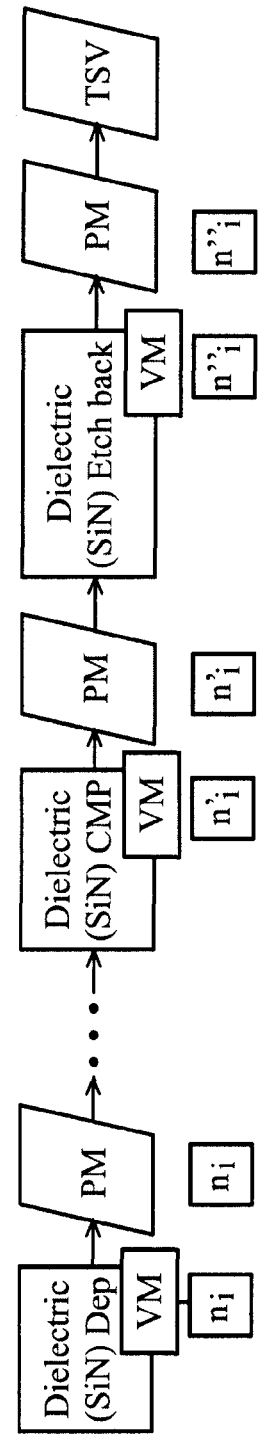

FIGS. 2A through 2F are fragmentary sectional views of an IC structure 150 at various fabrication stages constructed according to aspects of the present disclosure in one or more embodiments. In the present embodiment, the IC structure 150 is a portion of the IC structure 100 for simplicity. FIGS. 3A and 3B are block diagrams illustrating processing flow of an IC fabrication method 155 constructed according to aspects of the present disclosure in one or more embodiments. In FIGS. 3A and 3B, "VM" represents a virtual metrology tool (or virtual metrology) to generate metrology data based on respective fabrication tool data and metrology data. "PM" represents a proper metrology tool (or physical metrology tool relative to the virtual metrology) to measure products from the respective fabrication tool for metrology data. The method 155 includes the method to form the IC structure 100 and further includes advanced process control (APC) integrated together to achieve efficiency and cost-effectiveness. The method 155 and the system to implement the method 155 are collectively described with reference to FIGS. 2A through 2F and FIGS. 3A and 3B. Each processing step may include a virtual metrology system and a physical metrology system associated with the respective fabrication tool at each processing step.

Referring FIGS. 2A and 3A, the method 155 includes collecting metrology data including the thickness $t_i$ of the substrate 102 at various locations at a proper stage, such as before the via etching (shown as "TSV Etch" in FIG. 3A). The subscript "i" stands for the location "i". Thickness $t_i$ is taken from the physical metrology tool, virtual metrology or combination thereof, depending on the availability of the physical metrology data and other consideration, such as metrology measurement cost with limited sampling measurement at a few locations. The following metrology data are collected in a similar strategy.

Still referring to FIGS. 2A and 3A, the method 155 also includes collecting the height $d_i$ of the TSV features 106 at different TSV locations (or via locations) after the via etching or after the formation of the TSV features 106 but before the grinding. The thickness $t_i$ will have a variation over locations due to various factors, such as the pattern density of the TSV feature 106.

Referring to FIGS. 2B and 3A, the method 155 includes collecting the thickness $t_i'$ of the substrate 102 at different locations after the grinding but before the recessing. A backside portion 152 of the substrate 102 is removed by the grinding process. The removed substrate thickness $g_i$ by the grinding is related to the thickness $t_i'$ of the substrate 102 by a formula $t_i'=t_i-g_i$. In the present example, the substrate thickness $t_i'$ is determined by the metrology data (virtual metrology, physical metrology or both). The removed substrate thickness $g_i$ is then determined according to the substrate thickness $t_i'$ using the above formula. In one example, the thickness $t_i'$ is either determined according to the physical metrology data after the grinding or the virtual metrology data that may be predicted before and/or during the grinding. Alternatively, the thickness $t_i'$ is determined based on the combined metrology data. In this case, the physical metrology data may be at least partially from other products processed previously.

The height $d_i'$ of the TSV features 106 may also be changed since the grinding may remove a portion of the TSV features 106. The height $d_i'$ of the TSV features 106 is related to the thickness $d_i'$ of the substrate 102 as follows.

$$d_i'=t_i' \text{ if } d_i >= t_i' \text{ and } d_i'=d_i \text{ if } d_i < t_i'$$

Accordingly, the height $d_i'$ of the TSV features 106 is also determined based on this formula.

Referring to FIGS. 2C and 3A, the method 155 also includes collecting the thickness $t_i''$ of the substrate 102 at different locations after the recessing process. Another backside portion 154 of the substrate 102 is removed by the recessing process. The removed substrate thickness $r_i$ by the recessing is related to the thickness $t_i''$ of the substrate 102 by a formula $t_i''=t_i'-r_i$. In the present example, the substrate thickness $t_i''$ is determined by the metrology data (virtual metrology, physical metrology or both). The removed thickness $r_i$ is then determined according to the substrate thickness $t_i''$ using the above formula. In one example, the thickness $t_i''$ is either determined according to the physical metrology data after the grinding or the virtual metrology data that may be predicted before and/or during the recessing. Alternatively, the thickness $t_i'$ is determined based on the combined metrology data. In this case, the physical metrology data may be at least partially from other products processed previously.

The height $d_i''$ of the TSV features 106 after the recessing is the same to the height $d_i'$ of the TSV features 106 after the grinding as $d_i''=d_i'$ since the recessing process only selectively etches the substrate 102.

Referring 2D and 3B, the method 155 includes collecting the thickness $n_i$ of the backside dielectric (e.g., SiN) layer 118 at different locations after the backside dielectric deposition ("Dielectric (SiN) Dep" in FIG. 3B).

Referring 2E and 3B, the method 155 includes collecting the thickness $n_i'$ of the backside dielectric layer 118 at different locations after the backside dielectric CMP ("Dielectric (SiN) CMP" in FIG. 3B). The backside dielectric thickness is reduced from $n_i$ to $n_i'$ by the backside dielectric polishing. The backside dielectric polishing may also change the height of the TSV features 106 to $d_i'''$. The height $d_i'''$ of the TSV feature 106 at this stage is related to the backside dielectric thickness $n_i'$ as in the formula $d_i'''=t_i''+n_i'$ if $t_i''+n_i' <= d_i''$ and $d_i'''=d_i''$ otherwise.

Referring 2F and 3B, the method 155 includes collecting the thickness $n_i''$ of the backside dielectric layer 118 at different locations after the backside dielectric etch-back ("Dielectric (SiN) Etch Back") in FIG. 3B). The backside dielectric thickness is reduced from $n_i'$ to $n_i''$ by the backside dielectric etch-back. The yield and/or open risk area can be evaluated based on the above collected metrology data and according to one model explained below.

TSV protrusion is defined as a parameter to a protrusion amount of the TSV features 106 and is related to various parameters as TSV protrusion=$d_i'''-t_i''-n_i''$. If the TSV protrusion is positive, the respective TSV feature is protruded from the backside surface of the substrate 102. If the TSV protrusion is negative, the respective TSV feature is not protruded from the backside surface of the substrate 102 and there is open failure risk. Thus, open risk is a function of the TSV protrusion as open risk=$f$(TSV protrusion).

In one embodiment, the open risk function f( ) is defined as: open risk is zero if the TSV protrusion is positive and large enough, such as greater than a predefined margin according to the manufacturing data; open risk is 1 (100% or failure) if the TSV protrusion is negative and large enough, such as greater than the predefined margin; and the open risk is between 0 and 1 (a certain possibility of open failure) when the TSV protrusion is close to zero and its magnitude is within a certain range, such as the predefined margin. The open risk function may be defined more precisely according to more manufacturing data including processing variation, such as process capability Cpk. For example, the predefined margin is defined according to the process variation or the process capability Cpk.

The open risk function is also a function of substrate locations. Therefore, the open risk function provides a prediction to yield or provides a virtual yield map. The open risk function also defines one or more risky region (hot spot) for further actions. The further action includes scraping, rework, feeding-forward to a later processing step, feeding-back to tune processing parameters, marking a failed die, and combination thereof. Which action to chosen may base on the evaluation of the open risk or its distribution over the locations or other statistical data thereof, such as average open risk.

Figure 4:
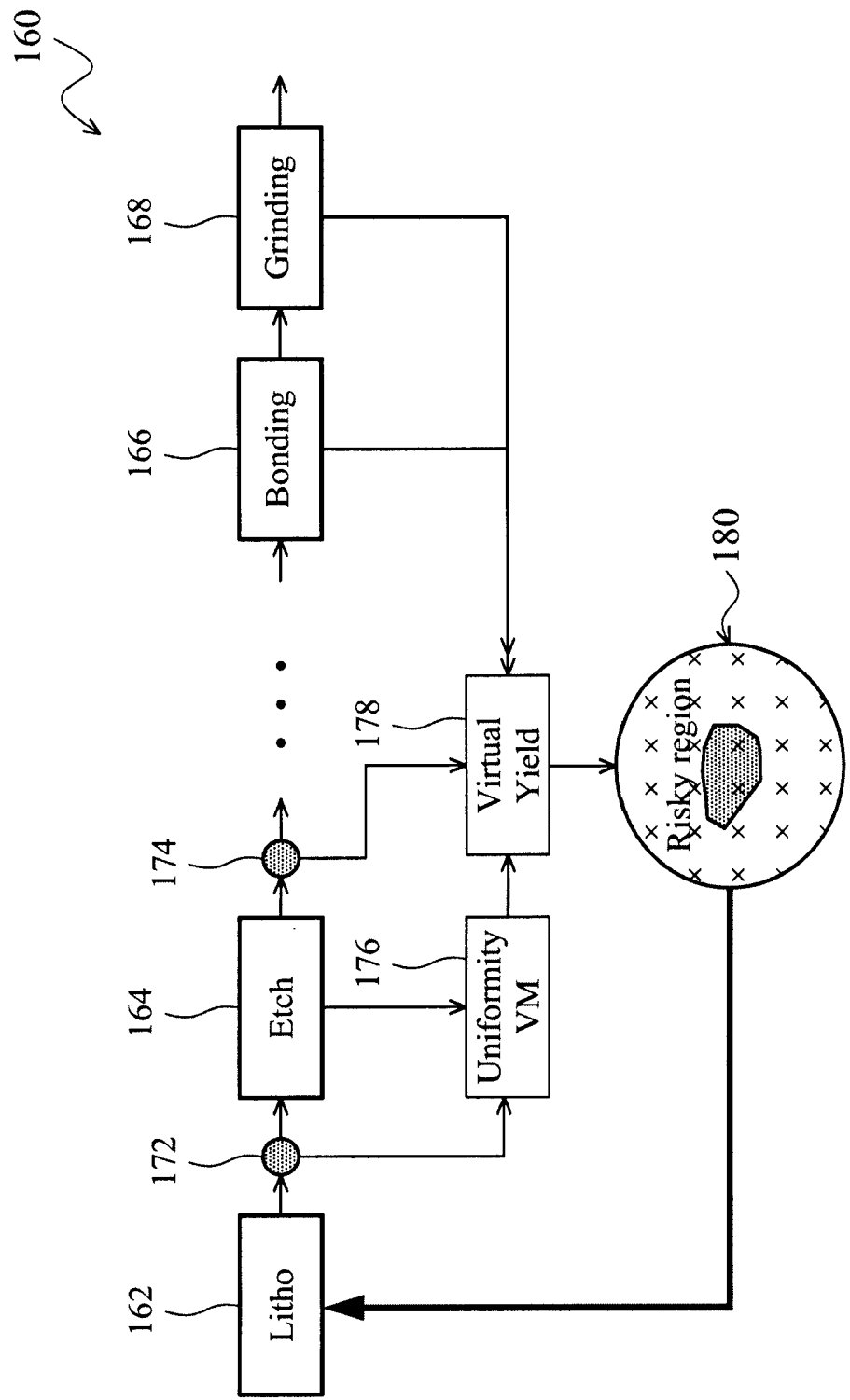
FIG. 4 is a block diagram illustrating an IC fabrication system and corresponding IC fabrication method constructed according to one embodiment.

FIG. 4 is a block diagram illustrating an IC fabrication method 160 and corresponding IC fabrication system constructed according to one embodiment. The IC fabrication method 160 includes performing a plurality of processing steps that includes a lithography process 162 to define via regions; a via etch 164 to form TSV holes; a bonding process 166; a grinding process 168 and so on. The IC fabrication method 160 also includes collecting various metrology data, such as metrology data 172 after the lithography process, metrology data 174 after the via etch, and so on. The metrology data include in-situ metrology data from respective processes. The metrology data include physical metrology data from respective metrology tools and virtual metrology data based on respective simulation models.

Those metrology data are collected and data-mined for parameter distribution, variation and uniformity, such as TSV via depth distribution, by a uniformity virtual metrology module 176 that includes model and rules incorporated in algorithm to be implemented by a computer, a microprocessor or like.

The method also includes performing a yield analysis by a virtual yield module 178 based on the metrology data, generating a virtual yield (map) 180 to a substrate. The virtual yield module includes model and rules incorporated in algorithm to be implemented by a computer, a microprocessor or like. In one embodiment, the model used to generate the virtual yield is the model described in FIG. 3. For example, the yield and the open risk are defined as a function of the TSV protrusion. Thus, various risky regions are identified in the virtual yield map. The virtual yield map and the risky regions are feedback to tune process parameters or feed forward to later process steps for compensation to reduce the issue identified in the risky regions. In one example, the yield map and the risky regions are feedback to the lithography process to tune lithography process, such as tuning exposure dose and/or developing recipe.

Figure 5:
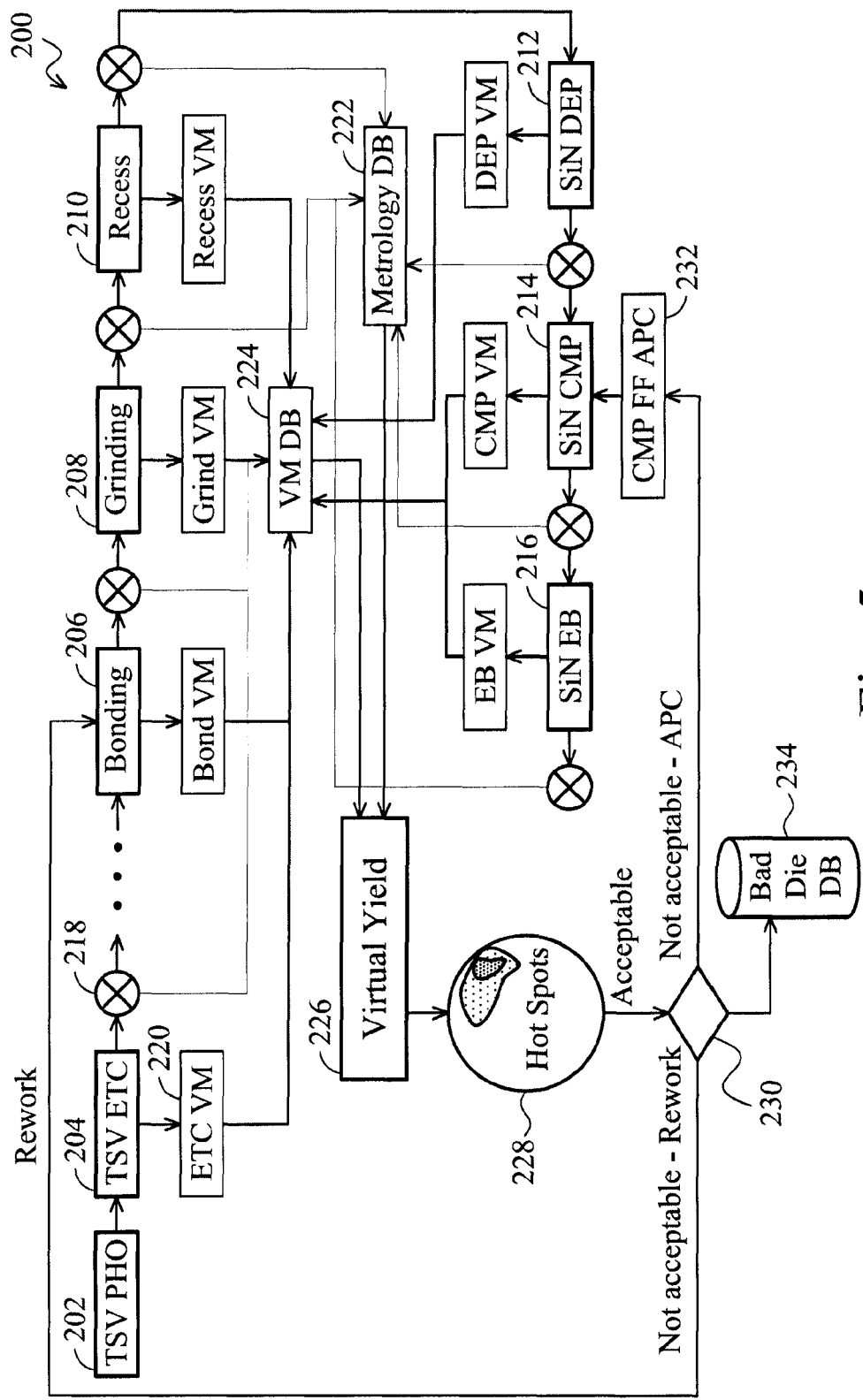
FIG. 5 is a block diagram illustrating an IC fabrication system and corresponding IC fabrication method constructed according to another embodiment.

FIG. 5 is a block diagram illustrating an IC fabrication method 200 and corresponding IC fabrication system constructed according to another embodiment. The IC fabrication method 200 includes performing a plurality of processing steps that includes a lithography process ("TSV PHO") 202 to define via regions; a via etch ("TSV ETC") 204 to form TSV holes; a bonding process ("bonding") 206; a grinding process ("grinding") 208; a recessing process ("recess") 210, backside dielectric (such as SiN) deposition ("SiN Dep") 212, backside dielectric polishing CMP ("SiN CMP") 214, backside dielectric etch-back ("SiN EB") 216 and so on.

The IC fabrication method 200 also includes collecting various metrology data including physical metrology data from metrology tools ("⊗") 218 and virtual metrology data according to the fabrication tools. The virtual metrology (VM) data includes via etch VM data by via etch VM module ("ETC VM") 220 and other virtual metrology data from respective virtual metrology module associated with respective processing steps as illustrated in FIG. 5. The virtual metrology modules each include respective simulation models to generate virtual data according to respective fabrication tool data and respective process recipes.

Those metrology data are collected and data-mined. Particularly, the physical metrology data are collected to a physical metrology database ("Metrology DB") 222 and the virtual metrology data are collected to a virtual metrology database ("VM DB") 224. The metrology data from the physical metrology database 222 and the virtual metrology database 224 are provided to a virtual yield module 226 that is designed to generate a virtual yield (map) 228 to a substrate. The virtual yield module 226 includes a yield model incorporated in algorithm to be implemented by a computer, a microprocessor or like. In one embodiment, the yield model is the model described in FIG. 3. For example, the yield is defined as a function of the TSV protrusion.

Accordingly, various risky regions (hot spots) are identified based on the virtual yield map 228. The virtual yield map and the risky regions are provided to an action module 230 to decide a proper action in response to the identified hot spots. In embodiment, after the evaluation of the virtual yield map, if it is not acceptable according certain criteria, the action includes rework to the substrate, such as rework at the CMP step.

In another embodiment, if the evaluation finds the substrate is not acceptable, the action includes feeding forward to later processing steps to tune the respective processes such that the open issue is fixed by the compensation from the tuned later processes, such as backside dielectric CMP 214 through a CMP feed forward APC module 232. In this example, the backside dielectric CMP process is tuned with a longer CMP time such that a short TSV feature is protruded and the open issue is fixed.

In yet another embodiment, according to the evaluation, if the open issue in the substrate can not be fixed by either rework or feed forward for compensation, then the risky TSV dies are recorded in a database 234 so the identified die is scraped without proceeding to use in the 3D integration at subsequent process steps, thus, functional IC chips are saved without being scraped with the risky TSV dies.

In yet another embodiment, the virtual yield map is feedback to the via etch process to tune the via etch process such that the via etch process can reduce the open risk when being applied to other TSV substrates.

Figure 6:
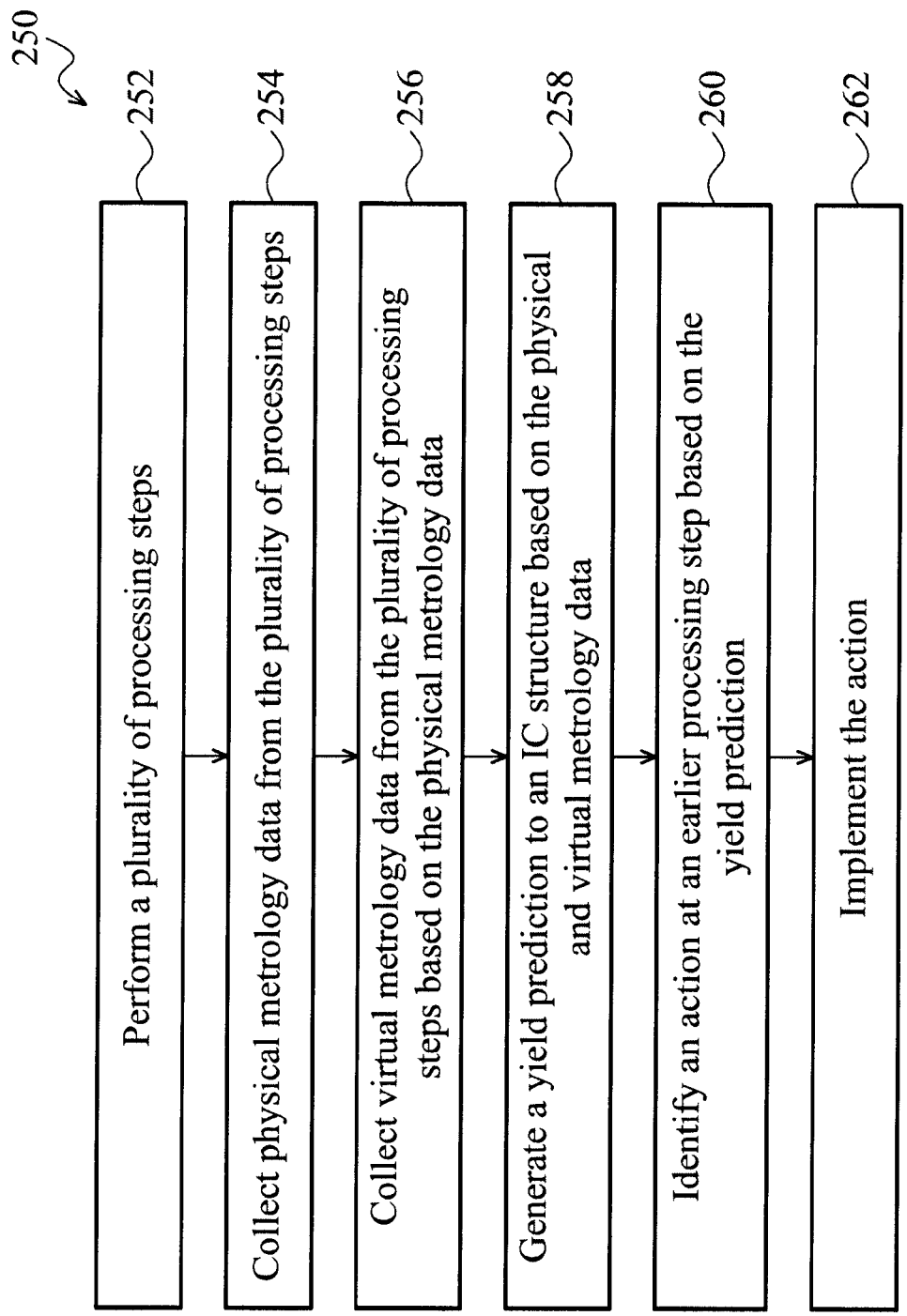
FIG. 6 is a flowchart of an IC fabrication method in one embodiment.

FIG. 6 is a flowchart of an IC fabrication method 250 constructed according to another embodiment. The method 250 includes performing a plurality of processing steps at step 252. The plurality processing steps include lithography process to define via regions, via etching, metal deposition to form TSV features, TSV CMP, bonding with a glass substrate, grinding, recessing by selective etch, backside dielectric deposition, backside dielectric CMP, backside dielectric etch-back, and forming RDL according to one example.

The IC fabrication method 250 includes a step 254 by collecting physical metrology data from respective metrology tool at respective processing steps.

The IC fabrication method 250 includes a step 256 by collecting virtual metrology data of respective processing steps based on the physical metrology data. In one example, when the physical metrology data are not available or not enough for yield prediction, the virtual metrology data are generated and are used to this purpose. In another example, the virtual metrology data are generated according to a simulation model and the batch patterns and/or wafer pattern extracted from the physical metrology data.

The IC fabrication method 250 includes a step 258 by generating a yield prediction to an IC structure based on the physical and virtual metrology data. In the present example, the IC structure is a TSV substrate to be formed by the plurality of processing steps. The yield prediction is generated according to a yield model such as the model of FIG. 3 used to generate open risk and yield. Particularly, the yield model includes a formula that defines the open risk as a function of the TSV protrusion.

The IC fabrication method 250 includes a step 260 by identifying an action at an earlier processing step based on the yield prediction. In one embodiment, the action includes one selected from the group consisting of scraping, rework, feeding-forward to a later processing step, feeding-back to tune processing parameters, marking a failed die, and combination thereof.

The IC fabrication method 250 includes a step 262 by performing the action. For example, the rework is applied to the IC structure to fix the open issue. In another example, the rework includes perform another via etch to increase the TSV via depth.

Figure 7:
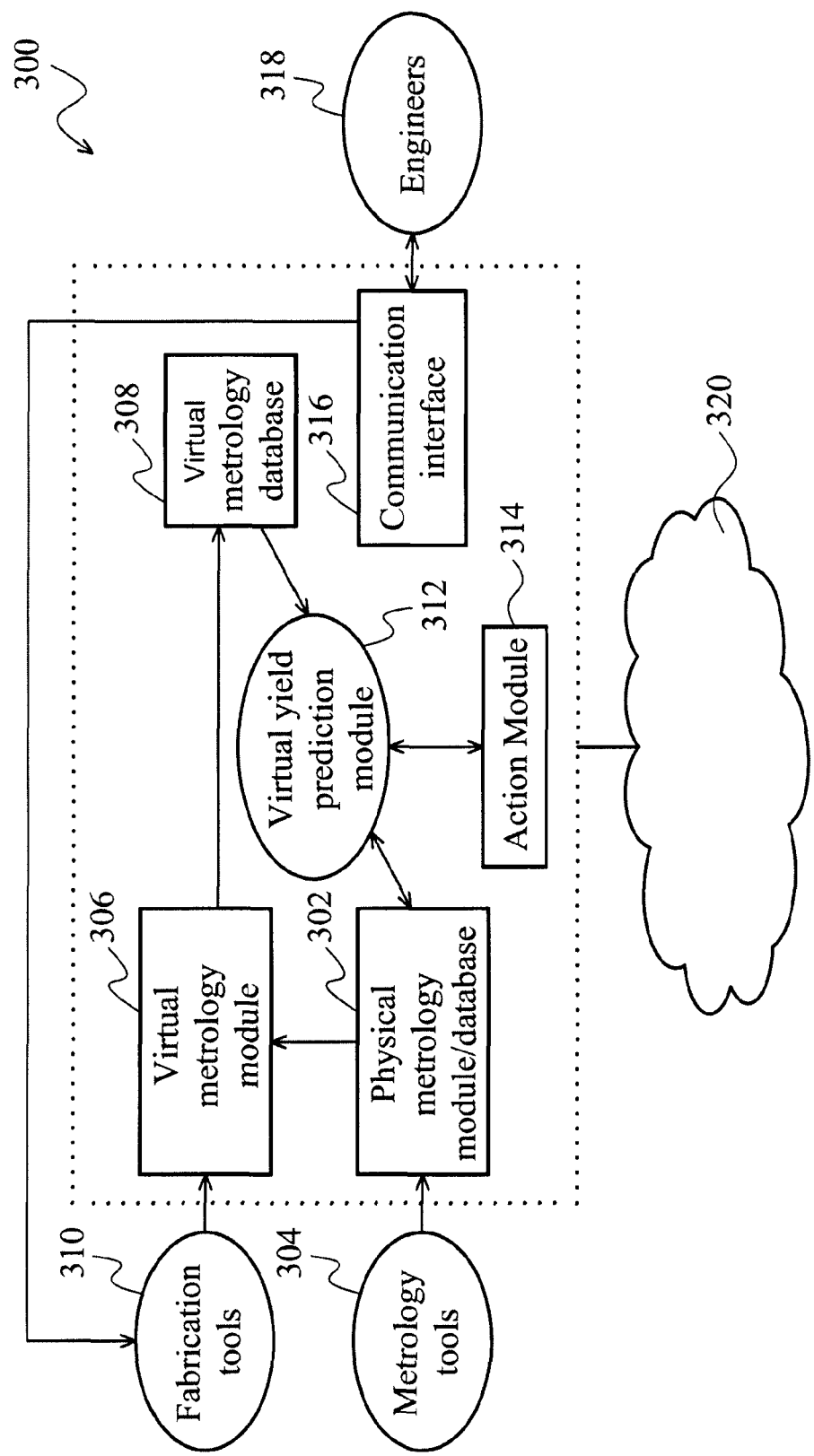
FIG. 7 is one embodiment of an IC fabrication system.

FIG. 7 is a block diagram of one embodiment of an IC fabrication system 300 to implement the disclosed IC fabrication method, such as the method 150 of FIGS. 3A and 3B, the method 160 of FIG. 4, or the method 200 of FIG. 5.

The system 300 includes a physical metrology module 302 to collect physical metrology data from the metrology tools 304. In the present embodiment, the physical metrology module 302 includes a physical metrology database to save the collected physical metrology data. The metrology tools 304 may includes optical scope to measure critical dimension (CD), a metrology tool to measure via depth or a metrology tool to measure film or substrate thickness. In other example, the metrology tools 310 may include electrical, optical, and/or analytical tools, such as microscopes, micro-analytical tools, line width measurement tools, surface analysis tools, film thickness measurement tools, and other test and measurement tools.

The system 300 includes a virtual metrology module 306 to generate virtual metrology data and a virtual metrology database 308 to store the virtual metrology data. The virtual metrology module 306 is coupled with fabrication tools for tool parameters and is coupled with the physical metrology database that may be used to extract various data patterns such as substrate pattern and batch pattern incorporated in generating proper virtual metrology data.

The system 300 includes a virtual yield prediction module 312 to generate virtual yield prediction of an IC structure (such as a TSV substrate) based on the physical and virtual metrology data. The virtual yield prediction module 312 includes one or more models used to generate the virtual yield. In one embodiment, the model includes a model of FIG. 3B where the virtual yield is a function of the TSV protrusion. The virtual yield prediction module 312 may also identify open risky regions of the IC structure.

The system 300 may further include an action module 314 to determine an action based on the virtual yield prediction, such as average of the yield and/or the identified risky regions. In one embodiment, the action includes one selected from the group consisting of scraping, rework, feeding-forward to a later processing step, feeding-back to tune processing parameters, marking a failed die, and combination thereof.

The system 300 may also includes an communication interface 316 to enable communication with engineer 318 and the fabrication tools 310. The system 300 is connected to a network 320, such as the Internet or an intranet. Various communication and coupling may be achieved through the network. For example, the metrology tools 304 and the fabrication tools 310 are coupled with the system 300 through the network 320.

In one embodiment, the various steps and procedures of the disclosed method in various embodiments may be implemented in the system 300. The system 300 may further include additional components combined, distributed, and coordinated to be operable to generate the virtual yield prediction.

The virtual yield prediction system 300 may be adaptive such that it is dynamically maintained to fit to the IC fabrication and follow changes of the fabrication tools over time. The communication interface 316 may provide an alarm to the engineers 318 when the open risk is identified. The predicted virtual yield may be sent to a data control center such as a manufacturing execution system (MES) system wherein the predicted virtual yield is further processed, organized, and distributed for data monitoring, evaluation, analysis, and/or control such as statistical process control (SPC). In another example, the virtual yield prediction is sent to the customer if the physical yield test, such as CP test, is eliminated by the customer for cost issue.

The system 300 serves only as an example to the present disclosure. Each module thereof may include software and/or hardware to implement its functions. For example, the virtual yield prediction module may include hardware such as computer and memory for operation and storage. The corresponding yield prediction model may include software for generation and maintenance thereof. Each module may be configured and connected to other modules and other components of the semiconductor manufacturer. The system 300 may be configured and organized in different ways such as with less or more modules without departure from the spirit of the present disclosure. In one example, the system 300 may be connected to or included as part of a virtual fab of FIG. 8, which will be described later.

Thus, the virtual yield prediction can be alternatively generated by the system 300 other than directly measuring. Based on the physical and virtual metrology data, with limited metrology tools and measurement cost, the yield can be effectively monitored for enhanced process performance and enhanced wafer yield. The disclosed method and system provide a new approach for TSV wafer fabrication monitor and control with enhanced efficiency and reduced cost (including measurement and metrology cost).

Figure 8:
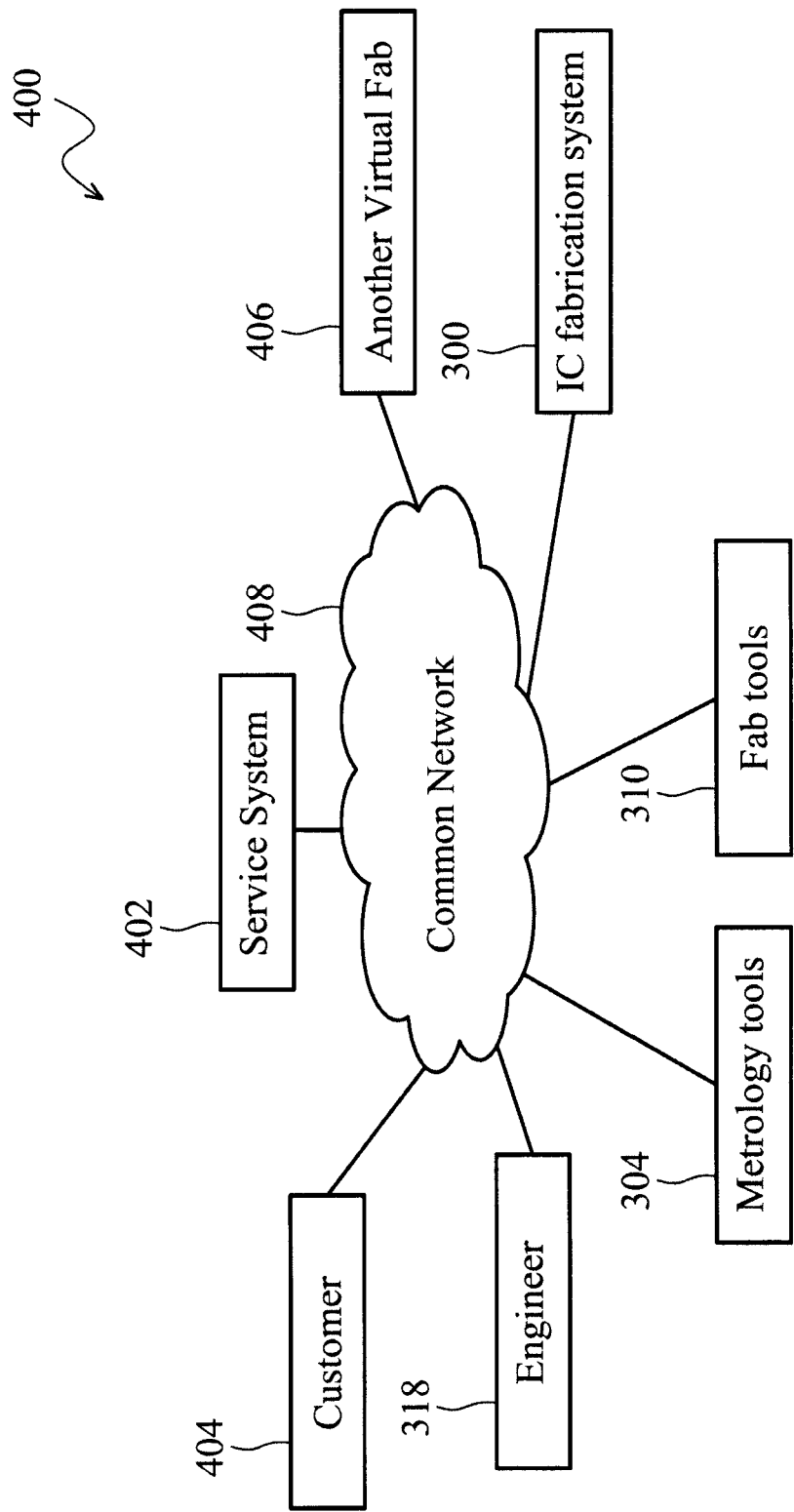

FIG. 8 illustrates a virtual integrated circuit fabrication system (a "virtual fab") 400, to which the system 300 of FIG. 7 may be connected. The virtual fab 400 includes a plurality of entities 402, 404, 406, 300, 304, 310, and 318 that are connected by a communications network 408. The network 408 may be a single network or may be a variety of different networks, such as an intranet and the Internet, and may include both wireline and wireless communication channels.

In the present example, the entity 402 represents a service system for service collaboration and provision, the entity 404 represents a customer, the entity 318 represents an engineer, the entity 304 represents metrology tools for IC testing and measurement, the entity 310 represents fabrication tools including tools for via etch, grinding and recessing, the entity 300 represents an IC fabrication system 300 of FIG. 7, and the entity 406 represents another virtual fab (e.g., a virtual fab belonging to a subsidiary or a business partner). Each entity may interact with other entities and may provide services to and/or receive services from the other entities.

For purposes of illustration, each entity may be referred to as an internal entity (e.g., an engineer, customer service personnel, an automated system process, a design or fabrication facility, etc.) that forms a portion of the virtual fab 400 or may be referred to as an external entity (e.g., a customer) that interacts with the virtual fab 400. It is understood that the entities may be concentrated at a single location or may be distributed, and that some entities may be incorporated into other entities. In addition, each entity may be associated with system identification information that allows access to information within the system to be controlled based upon authority levels associated with entities identification information. The virtual fab 400 enables interaction among the entities for the purpose of IC manufacturing, as well as the provision of services. In the present example, IC manufacturing includes receiving a customer's IC order and the associated operations needed to produce the ordered ICs and send them to the customer, such as the design, fabrication, testing or virtual yield, and shipping of the ICs.

One of the services provided by the virtual fab 400 may enable collaboration and information access in such areas as design, engineering, and logistics. For example, in the design area, the customer 404 may be given access to information (such as virtual yield prediction) and tools related to their product via the service system 402. The tools may enable the customer 404 to perform yield enhancement analyses, view risky map, and obtain similar information. In the engineering area, the engineer 318 may collaborate with other engineers using fabrication information regarding pilot yield runs, risk analysis, quality, and reliability. The logistics area may provide the customer 404 with fabrication status, testing results, virtual yield results, order handling, and shipping dates. It is understood that these areas are exemplary, and that more or less information may be made available via the virtual fab 400 as desired.

Another service provided by the virtual fab 400 may integrate systems between facilities, such as between the metrology tools 304 and the fab tools 310. Such integration enables facilities to coordinate their activities. For example, integrating the metrology tools 304 and the fab tools 310 may enable manufacturing information to be incorporated more efficiently into the fabrication process, and may enable wafer data from the metrology tools to be returned to the fab tool for improvement and incorporation.

The above described method and system only serve as examples. The above method and system may be extended and modified and may include proper variations, embodiments, and alternatives without departure of the spirit of the invention. For example, the system 300 or the system 400 are configured and designed to coordinate in collecting both the physical metrology data and the virtual metrology data. In another example, the system 300 or the system 400 are configured and designed to coordinate in collecting both the physical metrology data and the virtual metrology data form multiple fabrication tools associated with the plurality processing steps, respectively. In yet another example, various disclosed methods may be combined or integrated to achieve the virtual yield prediction effectively and adaptively.

Thus, the present disclosure provides one embodiment of an integrated circuit (IC) fabrication method to form an IC structure having one or more through silicon via (TSV) features. The method includes performing a plurality of processing steps; collecting physical metrology data from the plurality of processing steps; collecting virtual metrology data from the plurality of processing steps based on the physical metrology data; generating a yield prediction to the IC structure based on the physical metrology data and the virtual metrology data; and identifying an action at an earlier processing step based on the yield prediction.

In one embodiment of the IC fabrication method, the action includes one selected from the group consisting of scraping, rework, feeding-forward to a later processing step, feeding-back to tune processing parameters, marking a failed die, and combination thereof.

In another embodiment, the plurality of processing steps include via etching, grinding; and recessing. In yet another embodiment, the earlier processing step includes the via etching; and the later processing step includes one of the grinding and the recessing.

In various other embodiments, the rework may include performing at another via etching process. The feeding-forward to a later processing step may include changing processing recipe for one of the grinding and the recessing. The feeding-back to tune processing parameters may include changing processing recipe for the via etching.

In another embodiment, the collecting virtual metrology data from the plurality of processing steps based on the physical metrology data includes collecting relevant virtual metrology data when the physical metrology data are not available or not enough for the yield prediction.

In yet another embodiment, the collecting virtual metrology data from the plurality of processing steps based on the physical metrology data includes extracting a batch pattern of batch products from the physical metrology data; and modifying the virtual metrology based on the batch pattern. In yet another embodiment, the collecting virtual metrology data from the plurality of processing steps based on the physical metrology data includes extracting a substrate pattern from the physical metrology data; and modifying the virtual metrology based on the substrate pattern.

In yet another embodiment, the generating a yield prediction to the IC structure includes generating a yield prediction before forming a daisy chain on the IC structure and without performing chip probe (CP) test and wafer acceptance test (WAT) to the IC structure.

The present disclosure also provides another embodiment of an integrated circuit (IC) fabrication method. The method includes performing a plurality of processing steps including via etching, grinding, recessing, backside dielectric deposition, backside dielectric polishing, and backside dielectric etch-back to a plurality of through silicon via (TSV) substrates; collecting physical metrology data and virtual metrology data from the plurality of processing steps; combining the physical metrology data and the virtual metrology data to form combined metrology data; generating a yield prediction to various chip regions of the TSV substrate based on the combined metrology data; identifying an action step based on the yield prediction; and implementing the action to a TSV substrate.

In one embodiment, the IC fabrication method further includes performing the via etching to the TSV substrate; and generating virtual parameters from at least one of the plurality of processing steps based on the combined metrology data, tool parameters of a via etching tool for performing the via etching to the TSV substrate and processing parameters of the via etching process to the TSV substrate.

In another embodiment, collecting physical metrology data and virtual metrology data includes: collecting a first thickness $t_i$ of the TSV substrates over substrate locations; collecting a first height $d_i$ of the TSV features over the substrate locations and associated with the via etching; collecting a second thickness $t_i'$ of the TSV substrates over the substrate locations and associated with the grinding, wherein a second height $d_i'$ of the TSV features is determined as $d_i'=t_i'$ if $d_i>=t_i'$ and $d_i'=d_i$ if $d_i<t_i'$; and collecting a third thickness $t_i''$ of the TSV substrates over the substrate via locations and associated with the recessing, wherein a third height $d_i''$ of the TSV features is determined as $d_i''=d_i'$.

In yet another embodiment, collecting physical metrology data virtual metrology data further includes: collecting a first backside dielectric thickness $n_i$ of the TSV substrates over the substrate locations and associated with the backside dielectric deposition; collecting a second backside dielectric thickness $n_i'$ of the TSV substrates over the substrate locations and associated with the backside dielectric polishing, wherein a fourth height $d_i'''$ of the TSV features is determined as $d_i'''=t_i''+n_i'$ if $t_i''+n_i'<=d_i''$ and $d_i'''=d_i''$ otherwise; and collecting a third backside dielectric thickness $n_i''$ of the TSV substrates over the substrate locations and associated with the backside dielectric etch-back.

In yet another embodiment, the generating a yield prediction to various chip regions of the TSV substrate based on the combined metrology data includes defining: TSV protrusion=$d_i'''-t_i''-n_i''$; and open risk=f(TSV protrusion) wherein f( ) is an open risk function relates the open risk with the TSV protrusion.

In yet another embodiment, the open risk function is defined as: the open risk is zero if the TSV protrusion is positive and is greater than a predefined value; the open risk is 1 if the TSV protrusion is negative and its amplitude is greater than the predefined margin; and the open risk is greater than 0 and less than 1 if the TSV protrusion has an amplitude less than the predefined margin.

In yet another embodiment, the generating a yield prediction includes generating the yield prediction according to the open risk; and the identifying an action step based on the yield prediction includes choosing the action step according to the open risk. In yet another embodiment, the action includes one selected from the group consisting of scraping, rework, feeding-forward to a later processing step, feeding-back to tune processing parameters, marking a failed die, and combination thereof.

The present disclosure also provides one embodiment of a virtual yield prediction system. The system includes physical metrology module designed to collect various physical metrology data associated with an integrated circuit fabrication process including via etching, grinding and recessing; a virtual metrology module designed to generate various virtual metrology data based on fabrication tools to perform the via etching, the grinding and the recessing, respectively; a virtual yield prediction module coupled with the virtual metrology module and the metrology tools; and an action module to generate an action item and coupled with the virtual yield prediction module.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An integrated circuit (IC) fabrication method to form an IC structure on a substrate having one or more through silicon via (TSV) features, comprising:
    performing a plurality of processing steps including via etching, grinding, and recessing;
    collecting physical metrology data from the plurality of processing steps, the physical metrology data including:
        a first thickness of the substrate;
        a first height of the one or more TSV features associated with the via etching;
        a second thickness of the substrate associated with the grinding;
        a second height of the one or more TSV features determined as a lesser one of the second thickness and the first height;
        a third thickness of the substrate associated with the recessing; and
        a third height of the one or more TSV features associated with the recessing;
    collecting virtual metrology data from the plurality of processing steps based on the physical metrology data;
    generating a yield prediction to the IC structure based on the physical metrology data and the virtual metrology data; and
    identifying an action at an earlier processing step based on the yield prediction.

2. The IC fabrication method of claim 1, wherein the action includes one selected from a group consisting of scraping, rework, feeding-forward to a later processing step, feeding-back to tune processing parameters of an earlier processing step, marking a failed die, and combination thereof.

3. The IC fabrication method of claim 2, wherein the rework includes performing another via etching process.

4. The IC fabrication method of claim 2, wherein the feeding-forward to the later processing step includes changing a processing recipe for one of the grinding and the recessing.

5. The IC fabrication method of claim 2, wherein the feeding-back to tune processing parameters includes changing a processing recipe for the via etching.

6. The IC fabrication method of claim 1, wherein:
the earlier processing step includes the via etching; and
the later processing step includes one of the grinding and the recessing.

7. The IC fabrication method of claim 1, wherein the collecting virtual metrology data from the plurality of processing steps based on the physical metrology data includes collecting relevant virtual metrology data when the physical metrology data are not available or not enough for the yield prediction.

8. The IC fabrication method of claim 7, wherein the collecting virtual metrology data from the plurality of processing steps based on the physical metrology data includes:
extracting a batch pattern of batch products from the physical metrology data; and
modifying the virtual metrology based on the batch pattern.

9. The IC fabrication method of claim 7, wherein the collecting virtual metrology data from the plurality of processing steps based on the physical metrology data includes:
extracting a substrate pattern from the physical metrology data; and
modifying the virtual metrology based on the substrate pattern.

10. The IC fabrication method of claim 1, wherein the generating the yield prediction to the IC structure includes generating a yield prediction before forming a daisy chain on the IC structure and without performing chip probe (CP) test and wafer acceptance test (WAT) to the IC structure.

11. The IC fabrication method of claim 1, further comprising generating virtual parameters from at least one of the plurality of processing steps based on the combined metrology data, tool parameters of a via etching tool for performing the via etching, and processing parameters of the via etching.

12. The IC fabrication method of claim 1, wherein the physical metrology data further includes:
a first backside dielectric thickness of the substrate associated with a backside dielectric deposition step;
a second backside dielectric thickness of the substrate and associated with a backside dielectric polishing step;
a fourth height of the TSV features is determined as a lesser one of the third height and a sum of the third thickness and the second backside dielectric thickness; and
a third backside dielectric thickness of the substrate associated with a backside dielectric etch-back step.

13. An integrated circuit (IC) fabrication method, comprising:
performing a plurality of processing steps including via etching, grinding, recessing, backside dielectric deposition, backside dielectric polishing, and backside dielectric etch-back to a plurality of through silicon via (TSV) substrates;
collecting physical metrology data and virtual metrology data from the plurality of processing steps, the physical metrology data including:
a first thickness of the TSV substrates over substrate locations;
a first height of TSV features over the substrate locations and associated with the via etching;
a second thickness of the TSV substrates over the substrate locations and associated with the grinding;
a second height of the TSV features over the substrate locations and determined as a lesser one of the second thickness and the first height;
a third thickness of the TSV substrates over the substrate locations and associated with the recessing; and
a third height of the TSV features over the substrate locations and associated with the recessing;
combining the physical metrology data and the virtual metrology data to form combined metrology data;
generating a yield prediction to various chip regions of the TSV substrate based on the combined metrology data;
identifying an action step based on the yield prediction; and
implementing the action step on a TSV substrate.

14. The IC fabrication method of claim 13, further comprising:
performing the via etching to the TSV substrate; and
generating virtual parameters from at least one of the plurality of processing steps based on the combined metrology data, tool parameters of a via etching tool for performing the via etching to the TSV substrate, and processing parameters of the via etching process to the TSV substrate.

15. The IC fabrication method of claim 13, wherein collecting physical metrology data and virtual metrology data further includes:
collecting a first backside dielectric thickness of the TSV substrates over the substrate locations and associated with the backside dielectric deposition;
collecting a second backside dielectric thickness of the TSV substrates over the substrate locations and associated with the backside dielectric polishing, wherein a fourth height of the TSV features is determined as a lesser one of (a) a sum of the third thickness and the second backside dielectric thickness and (b) the third height; and
collecting a third backside dielectric thickness of the TSV substrates over the substrate locations and associated with the backside dielectric etch-back.

16. The IC fabrication method of claim 15, wherein the generating the yield prediction to various chip regions of the TSV substrate based on the combined metrology data includes defining:
a TSV protrusion determined as a difference between (a) the fourth height and (b) a sum of the third thickness and third backside dielectric thickness; and
an open risk based on an open risk function that relates to the open risk with the TSV protrusion.

17. The IC fabrication method of claim 16, wherein the open risk function is defined as:
the open risk is zero if the TSV protrusion is positive and is greater than a predefined margin;
the open risk is 1 if the TSV protrusion is negative and its amplitude is greater than the predefined margin; and
the open risk is greater than 0 and less than 1 if the TSV protrusion has an amplitude less than the predefined margin.

18. The IC fabrication of claim 17, wherein:
the generating the yield prediction includes generating the yield prediction according to the open risk; and
the identifying the action step based on the yield prediction includes choosing the action step according to the open risk.

19. The IC fabrication method of claim 13, wherein the action includes one selected from a group consisting of scraping, rework, feeding-forward to a later processing step, feeding-back to tune processing parameters, marking a failed die, and combination thereof.

20. A virtual yield prediction system, comprising:
- a physical metrology module designed to collect various physical metrology data associated with an integrated circuit fabrication process including via etching, grinding and recessing, the physical metrology data comprising:
  - a first thickness of a substrate;
  - a first height of features over associated with the via etching;
  - a second thickness of the substrate associated with the grinding;
  - a second height of the features determined as a lesser one of the second thickness and the first height;
  - a third thickness of the substrate associated with the recessing; and
  - a third height of the features associated with the recessing;
- a virtual metrology module designed to generate various virtual metrology data based on fabrication tools to perform the via etching, the grinding, and the recessing, respectively;
- a virtual yield prediction module coupled with the virtual metrology module and metrology tools; and
- an action module to generate an action item and coupled with the virtual yield prediction module.

* * * * *